United States Patent
Jacobsson et al.

(10) Patent No.: US 8,525,604 B2
(45) Date of Patent: Sep. 3, 2013

(54) OSCILLATOR ARRANGEMENT

(75) Inventors: Harald Jacobsson, Vastra Frolunda (SE); Mikael Andreasson, Rolfstorp (SE); Kjell Larsson, Hisings Backa (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 12/665,183

(22) PCT Filed: Jun. 20, 2007

(86) PCT No.: PCT/SE2007/050440
§ 371 (c)(1),
(2), (4) Date: Dec. 17, 2009

(87) PCT Pub. No.: WO2008/156396
PCT Pub. Date: Dec. 24, 2008

(65) Prior Publication Data
US 2010/0188160 A1    Jul. 29, 2010

(51) Int. Cl.
*H03K 3/282* (2006.01)
(52) U.S. Cl.
USPC .................. 331/117 R; 331/46; 331/167
(58) Field of Classification Search
USPC ........... 331/46, 48, 45, 117 V, 117 R, 117 FE, 331/167
See application file for complete search history.

(56) References Cited

U.S. PATENT DOCUMENTS

| | | | |
|---|---|---|---|
| 7,212,075 B2* | 5/2007 | Young et al. | 331/176 |
| 7,299,006 B1* | 11/2007 | Rofougaran et al. | 455/20 |
| 7,391,271 B2* | 6/2008 | Cranford et al. | 331/17 |
| 2004/0066241 A1 | 4/2004 | Gierkink et al. | |
| 2004/0150484 A1* | 8/2004 | Jacobsson et al. | 331/117 R |
| 2008/0284530 A1* | 11/2008 | Pellerano et al. | 331/1 A |

FOREIGN PATENT DOCUMENTS

| | | |
|---|---|---|
| JP | 57065051 A | 4/1982 |
| JP | 2003-209469 | 7/2003 |
| JP | 2004-534468 A | 11/2004 |
| WO | 03005560 A1 | 1/2003 |
| WO | 2007040429 A1 | 4/2007 |

OTHER PUBLICATIONS

Nick, M., et al., "Phase-Noise Measurement Using Two Inter-Injection-Locked Microwave Oscillators", IEEE Transactions on Microwave Theory and Techniques, vol. 54, No. 7, Jul. 2006, pp. 2993-3000.
Zirath, H., et al., "MMIC-Oscillator designs for ultra low phase noise", Compound Semiconductor Integrated Circuit Symposium, 2005, pp. 204-207.
Nick, M., et al., "Phase-Noise Measurement Using Two Inter-Injection-Locked Microwave Oscillators", IEEE Transactions on Microwave Theory and Techniques, vol. 54, No. 7, Jul. 2006, 8 pages.
Extended European Search Report from EP07748600.9-2215/2162982, dated May 23, 2012, 9 pages.

* cited by examiner

*Primary Examiner* — Joseph Chang
*Assistant Examiner* — Jeffrey Shin
(74) *Attorney, Agent, or Firm* — Rothwell, Figg, Ernst & Manbeck, P.C.

(57) ABSTRACT

The present invention relates to an oscillator arrangement, arranged for providing an oscillator output and phase noise detection and/or control of said oscillator output, the arrangement comprising a mixer (1) connected to a low-pass filter (2). The oscillator arrangement comprises a first oscillator (7) and a second oscillator (8), where the oscillators (7, 8) are inter-injection locked to each other by means of at least one coupling element (Q) in such a way that the oscillator output is acquired in quadrature automatically. The present invention also relates to a corresponding method.

23 Claims, 3 Drawing Sheets

OSCILLATOR ARRANGEMENT

CROSS REFERENCE TO RELATED APPLICATION

This application is a 35 U.S.C. §371 National Phase Application from PCT/SE2007/050440, filed Jun. 20, 2007, and designating the United States.

TECHNICAL FIELD

The present invention relates to an oscillator arrangement arranged for providing an oscillator output and phase noise detection and/or control of said oscillator output, the arrangement comprising a mixer connected to a low-pass filter.

The present invention also relates to a method for detecting and/or controlling phase noise from an oscillator arrangement.

BACKGROUND

Phase noise in oscillators, for example voltage-controlled oscillators (VCOs), is one of the most critical parameters in communications systems, particularly in wireless systems. Low phase noise VCOs bring a number of advantages to the system performance.

VCOs which are fully integrated on a semiconductor integrated circuit (IC) are today feasible for many communication systems. One is constantly striving for lower phase noise, since it can give further benefits to system performance. There is also a trade-off between phase noise and power consumption, which means that if phase noise is optimized, some of the phase noise performance may be traded-off for lower power consumption.

Phase noise in oscillators is strongly dependent on the signal amplitude in the oscillator. There is often a very distinct optimum amplitude where the phase noise has a minimum. Since this optimum amplitude may vary with tuning voltage (frequency), temperature, process (component) variations, ageing, etc., one solution is to try to integrate some form of automated amplitude regulation circuitry together with the VCO. It would be advantageous to measure phase noise and regulate the amplitude directly dependent on said measured phase noise.

Today, phase noise is measured with dedicated phase noise measurement systems. A new technique, based on locking two similar oscillators to each other, has recently been proposed in the paper "Phase-Noise Measurement Using Two Inter-Injection-Locked Microwave Oscillators", M. Nick, A. Banai, and F. Farzaneh, IEEE Trans. Microw. Theory Tech., Vol. 54, No. 7, pp. 2993-3000, July 2006.

This proposed technique is shown in prior art FIG. 1, where two oscillators P1, P2 operating at similar frequencies are inter-injection locked to each other by means of a first directional coupler P3, a second directional coupler P4 and a phase shifter P5 via an attenuator P6. The outputs of the locked oscillators P1, P2 are mixed together in a mixer P7 after another phase shift, in another phase shifter P8, on one of the outputs, creating a quadrature input to the mixer P7. The signal output from the mixer P7 is low pass filtered in a low-pass filter P9, amplified in a low noise amplifier P10 (LNA), digitized in an analog-to-digital converter P11 (ADC) and then Fourier transformed into the frequency domain by a fast Fourier transformer P12 (FFT), here illustrated as a computer (PC).

However, this measurement method makes regulation based on phase noise measurement difficult, since the directional couplers and the phase shifters are components that are impractical to integrate into the design, resulting in that those parts have to be discrete parts. This does not provide a practical regulation method that is directly dependent on the phase noise due to its bulkiness.

Therefore, an amplitude regulating circuitry according to prior art has to be based on some other parameter than phase noise that can be detected on-chip. Typically one tries to keep the amplitude itself constant (over temperature, tuning, etc.) to a preset value.

Such an amplitude regulating circuit does not give an optimum phase noise performance over all conditions, since the optimum amplitude varies. It is also difficult to measure the amplitude with sufficient accuracy without disturbing the VCO itself.

A further complication is that the phase noise often decreases fairly slowly with increasing amplitude, and then reaches a minimum. Hereafter it increases at a fast rate if the amplitude is further increased. In order to ensure that the oscillator does not enter into the region where phase noise increases rapidly, one has to back-off to a lower than optimum amplitude to have some margin for process variations, frequency variations, etc.

If regulation is not considered as necessary, it is nevertheless desired to have easily accessible phase noise measurement possibilities, preferably integrated in the design. Existing phase noise measurement equipment is, however, expensive, fairly slow, and very difficult to implement in production testing of integrated VCOs.

Therefore, phase noise is very seldom tested in production at all. Instead it is common to only test DC current consumption and from that result draw indirect conclusions about the phase noise performance of the VCO. This can mean that some VCOs with bad phase noise slip through testing and are mounted in products. Either the problem is detected in system tests, or it is not detected until the equipment is at the customer. In both cases the bad VCO causes very large costs.

To minimize this problem, test limits, on e.g. DC current consumption, are set very conservative. Therefore a lot of VCOs may unnecessarily be rejected, which results in large extra costs.

There is therefore a demand for a VCO where the signal performance with respect to phase noise is optimized using enhanced measurement equipment which is possible to use for each VCO in production, as well as for phase noise regulation purposes.

SUMMARY

The object of the present invention is to provide a VCO where the signal performance with respect to phase noise is optimized according to the above.

The object of the present invention is also to provide a phase noise measurement method, where the signal performance with respect to phase noise is optimized according to the above.

Such a VCO is described initially, and is further characterized in that the oscillator arrangement comprises a first oscillator and a second oscillator, where the oscillators are inter-injection locked to each other by means of at least one coupling element in such a way that the oscillator output is acquired in quadrature automatically.

Such a method is described initially, where further the oscillator arrangement is constituted by a first oscillator and a second oscillator, where the oscillators are inter-injection locked to each other by means of at least one coupling element in such a way that an output in quadrature is acquired automatically, where the method comprises connecting said output in quadrature to a mixer connected to a low-pass filter.

According to a preferred embodiment, the first oscillator and the second oscillator are differential oscillators.

By way of example, each differential oscillator is voltage-controlled and comprises a first drive transistor and a second drive transistor, the emitters of the first drive transistor and the second drive transistor of the first oscillator being connected to each other, and the emitters of the first drive transistor and the second drive transistor of the second oscillator being connected to each other, and where said at least one coupling element is connected between, on one hand, the emitters of the drive transistors of the first oscillator and, on the other hand, the emitters of the drive transistors of the second oscillator.

According to another preferred embodiment, at least a part of the detected phase noise is fed to a device for controlling the first oscillator and the second oscillator in such a way that a desired phase noise level is acquired.

According to another preferred embodiment, the low-pass filter is followed by a low noise amplifier, an analog to digital converter, and a computer device.

According to another preferred embodiment, the computer device is arranged for performing a fast Fourier transform. The Fourier transform may be output to a device which calculates the phase noise.

According to another preferred embodiment, the coupling element is a capacitor.

A number of advantages are obtained from the present invention, for example:
  The phase noise may be accurately measured in a cost-effective and simple way.
  Higher product yield, since much smaller safety margins are needed.
  Simple test instruments will suffice.
  Enables a design completely on a chip.

BRIEF DESCRIPTION OF THE DRAWINGS

The present invention will now be described more in detail with reference to the appended drawings, where.

DETAILED DESCRIPTION

Figure 1:
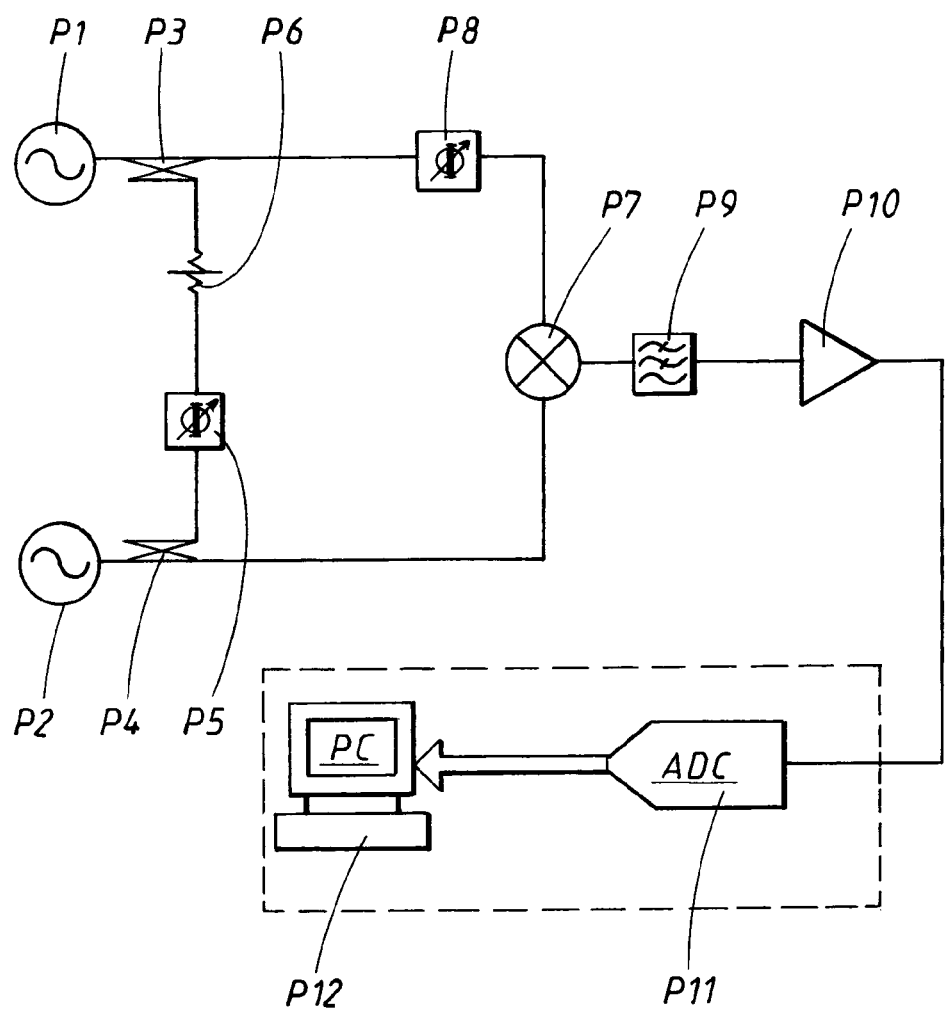
FIG. 1 shows a schematic for a prior art phase noise measurement equipment.
Figure 2:
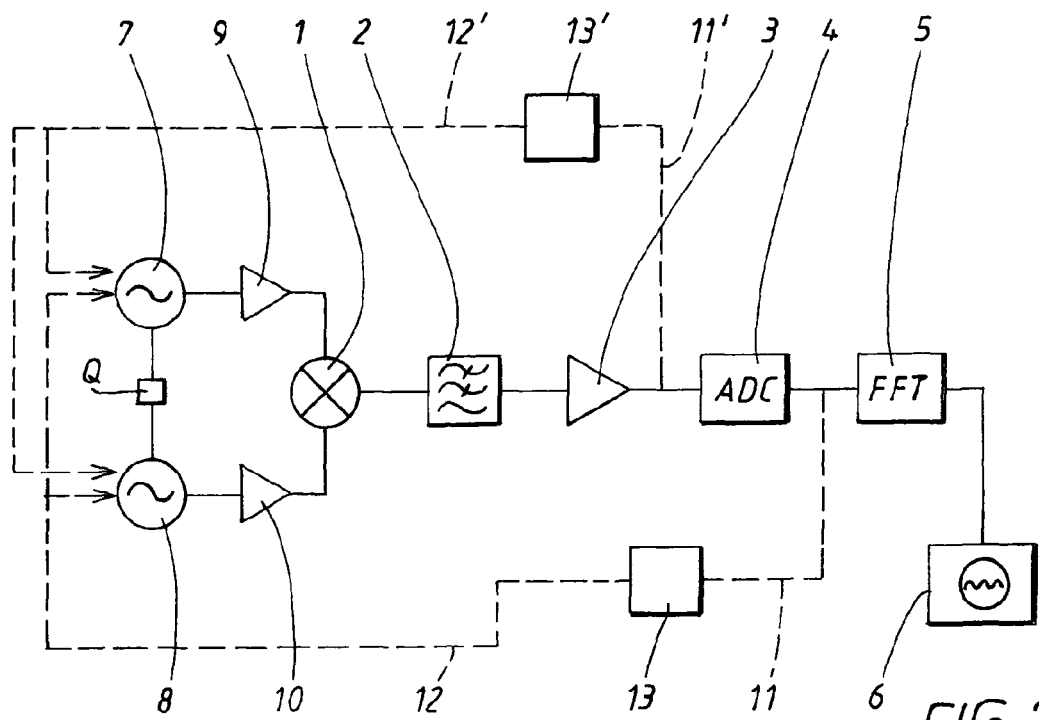
FIG. 2 shows a schematic for a first embodiment of the present invention.

According to a first embodiment of the present invention, with reference to FIG. 2, a phase noise measurement arrangement as described in the paper "Phase-Noise Measurement Using Two Inter-Injection-Locked Microwave Oscillators", M. Nick, A. Banai, and F. Farzaneh, IEEE Trans. Microw. Theory Tech., Vol. 54, No. 7, pp. 2993-3000, July 2006, discussed above, is taken advantage of.

Here, a mixer 1 is connected to a low-pass filter 2 followed by a low-noise amplifier 3 (LNA) and an analog-to-digital converter (ADC). The signal output from the mixer 1 is low pass filtered in the low-pass filter 2, amplified in the LNA 3 and digitized in the ADC 4. The ADC output is Fourier transformed into the frequency domain by a fast Fourier transform (FFT) device 5. All devices above are placed on one chip.

The mixer 1 is not difficult to make, but requires careful design to minimize its contribution to the so-called 1/f noise and DC offset if an absolute measurement is required. The mixer 1 is used to transform the signal with its noise information from the used carrier wave frequency to baseband. The phase noise is then measured as the ratio between the total base band power and noise power at certain frequency offsets at 1 Hz bandwidth. This is a standard measurement procedure for phase noise, and will not be discussed further.

The low-pass filter 2 is used to remove signal components of higher orders, more particularly a fundamental oscillator frequency and its high harmonics, from the low frequency band of interest, having a pass bandwidth which is usually somewhere in the range of 1 kHz and 10 MHz. This is thus a rather simple filter that should be easy to integrate on a chip The LNA 3 is relatively simple to implement since it is a low frequency signal, maximum a few tens of MHz, that should be amplified.

The ADC 4 is used to provide a digitized signal for the FFT device 5. The Fourier transformed signal is output to an external device 6, which calculates the phase noise from this signal.

According to the present invention, the input to the mixer is provided by a first VCO 7 and a second VCO 8, which VCOs 7, 8 are inter-injection locked. The VCOs 7, 8 feed the mixer 1 via a respective buffer amplifier 9, 10.

Figure 3:
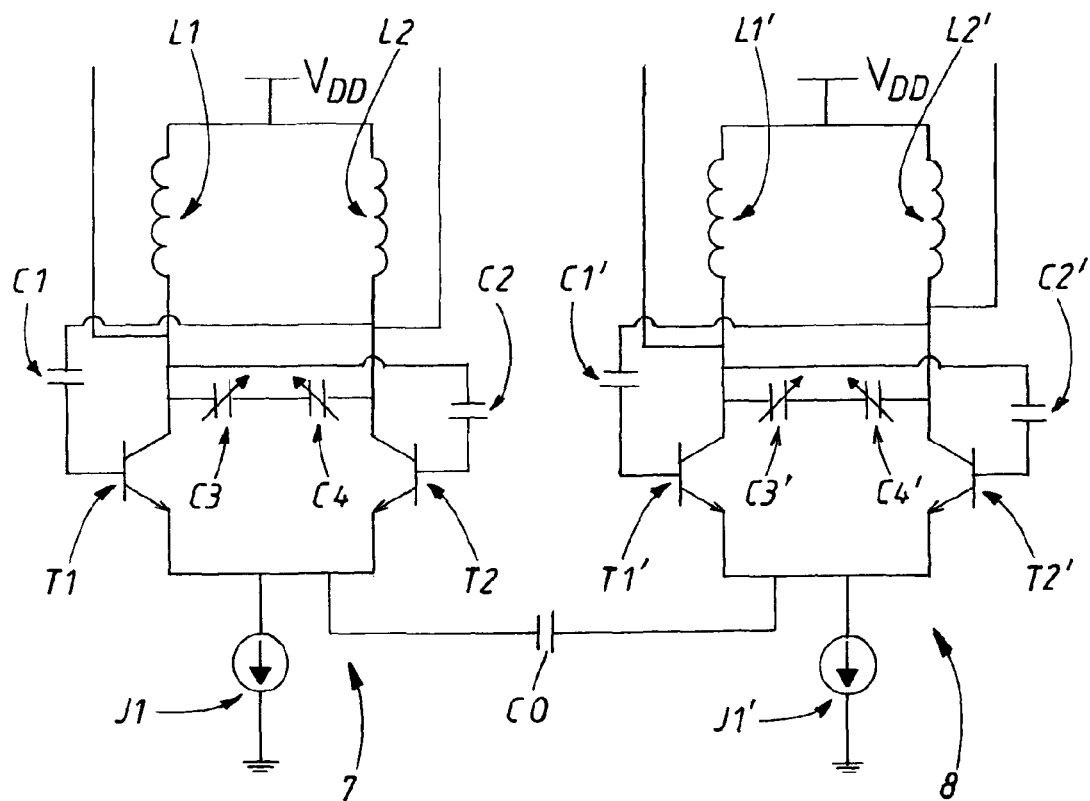
FIG. 3 shows a schematic for a differential oscillator used in the present invention.

In FIG. 3, a more detailed schematic of the VCOs 7, 8 is shown. The VCOs 7, 8 are constituted by differential oscillators. The first VCO 7 comprises a drive part with a first transistor T1, a second transistor T2 and first and second drive capacitors C1, C2 connected to the transistors' respective bases. The first VCO 7 comprises a resonator part with an inductance and a capacitance connected in parallel between the transistors' collectors. The inductance is illustrated as comprising first and second resonator inductances L1, L2 connected in series, and the capacitance is illustrated as comprising first and second variable resonator capacitances C3, C4 connected in series. The transistors' emitters are connected to each other and to a current source J1.

Corresponding components T1', T2', C1', C2', C3', C4', L1', L2', J1' are comprised in the second VCO 8. Furthermore, a coupling capacitance C0 is connected between the first VCO 7 and the second VCO 8, more in detail between the transistors' emitters of the respective VCOs. The coupling capacitance C0 ensures that the VCOs 7, 8 lock in quadrature.

The VCOs are further connected to a voltage source $V_{DD}$.

Such VCOs are previously known, but only for obtaining a lower phase noise and to acquire a lock in quadrature to be used for modulation and de-modulation of deterministic signals.

The present invention relies on the awareness of the fact that the VCOs deliver signals which are in quadrature in the way that is desired for the mixer in the phase noise measurement arrangement to function optimally. This further has the advantageous effect that the VCOs can be placed on the same chip as the phase noise measurement arrangement, since the VCOs do not comprise any discrete components.

With continued reference to FIG. 2, as depicted with a first dotted line 11, 12, a DSP (Digital Signal Processor) unit 13 is arranged for producing a certain output depending on an input from the ADC 4. This output constitutes a feed-back signal that is used to control the VCOs 7, 8 in such a way that they produce a desired phase noise level. The desired phase noise level may not be the lowest possible, but may be a trade off against power consumption.

The feed-back control signal may affect the VCOs 7, 8 in a number of different ways in order to control the phase noise. If the amplitude of the VCOs is affected, the detected noise normally has to be normalized first. Alternatively, if a respective filter in the VCOs 7, 8 is controlled, it is not necessary to have a normalized phase noise. Another alternative is to control a re-configurable circuitry in the respective VCO 7, 8, for example parallel transistors.

As depicted with a second dotted line 11', 12', showing an alternative to the feed-back discussed above, it is also possible to have a feed-back signal which has its input connected after the LNA 3, before the ADC 4. In this case, the feed-back signal is an analog signal which may have to be normalized, or not, depending on the cases above. There also has to be some sort of detection and control circuit 13' which is arranged for producing a certain control output depending on the input phase noise data, normalized or not.

The feed-back control signal and its normalization will be discussed in connection with the following embodiment examples.

The phase noise measurement arrangement may be altered after the LNA 3 depending on the desired functionality, resulting in a plurality of embodiment examples.

Figure 4:
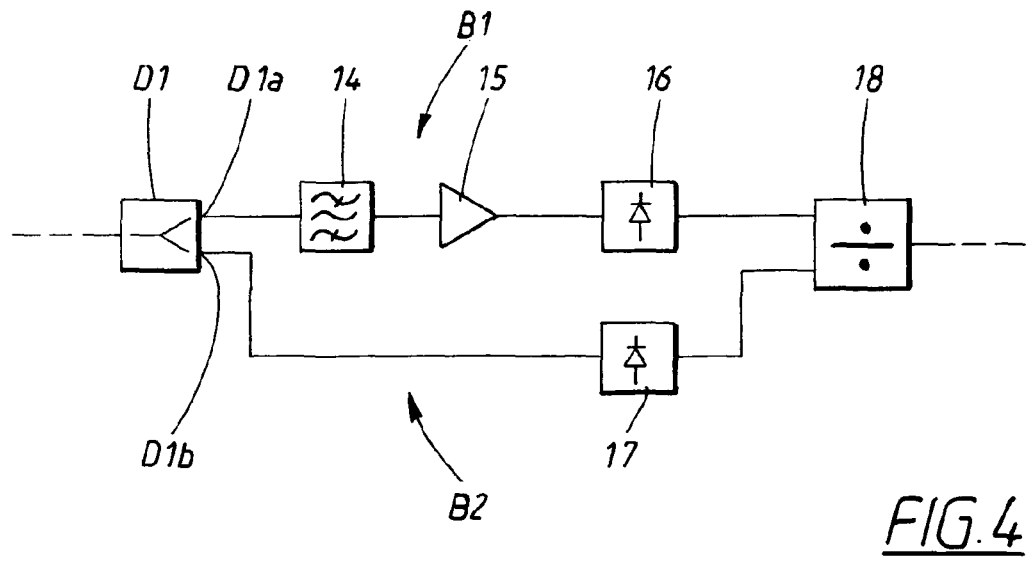
FIG. 4 shows a schematic for a second embodiment of the present invention.

According to a second embodiment example, with reference to FIG. 4 showing the circuitry following the LNA 3 in FIG. 2, the measurement arrangement is only going to be used for providing a normalized feed-back control signal to the VCOs 7, 8 for acquiring a desired phase noise. Here, the output from the LNA is minimized in a certain frequency interval. Neither the absolute values of phase noise, nor the complete frequency band information, are needed.

The signal output from the LNA 3 is divided by a power splitter D1 having an isolation between its first and second output ports D1a, D1b. The output from the first output port D1a is led in a first branch B1 and is filtered in a band pass filter 14 so that a frequency interval, corresponding to the frequency offset at which the phase noise shall be minimized, passes. The signal passes an amplifier 15 which compensates for losses in the filter 14, and its amplitude is detected by a first amplitude detecting circuit 16. The output is thus a DC signal, or nearly DC, and proportional to the phase noise power at the offset given by the band pass filter.

Since phase noise is determined by measuring the output noise per Hz, in a frequency interval, and divided with the total power in the signal, normalization is applied, the measurement arrangement providing a normalized feed-back control signal. Then the output from the second output port D1b is led past the band pass filter 14 and the amplifier 15 in a second branch B2, directly to a second amplitude detecting circuit 17. The outputs from the first amplitude detecting circuit 16 and the second amplitude detecting circuit 17 are divided with each other by a divider 18.

The normalized signal can then be fed into a control circuit (not shown) that controls the VCOs 7, 8 for acquiring a desired phase noise. For example, the VCO bias is controlled in such a way that the input signal, and thus the phase noise, is minimized.

The first and second amplitude measuring circuits 16, 17 may be linear or logarithmic. If the measuring circuits 16, 17 are logarithmic, the divider 18 is exchanged for a subtractor.

Figure 5:
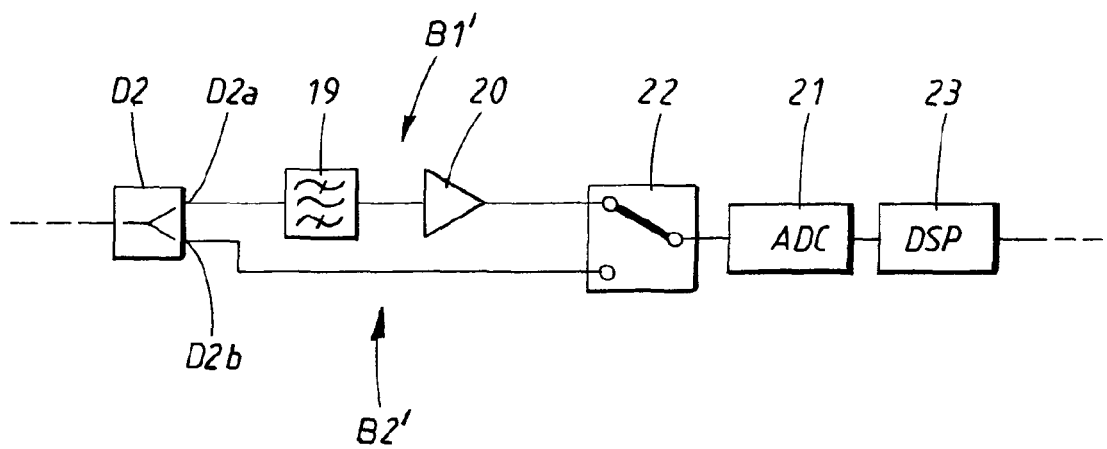
FIG. 5 shows a schematic for a third embodiment of the present invention.

In a third embodiment example, with reference to FIG. 5, the signal output from the LNA 3 is divided by a power splitter D2 having an isolation between its first and second output ports D2a, D2b. The output from the first output port D2a led in a first branch B1' and is filtered in a band pass filter 19 so that the frequency interval, corresponding to the frequency offset at which the phase noise shall be minimized, passes. The signal passes an amplifier 20 and is then fed into an ADC 21 in order to digitize the band pass filtered output, where the amplifier 20 compensates for the signal power which is filtered out in the band pass filter 19, such that the dynamic range requirements for the ADC 21 are lowered. This is of course not necessary, but reduces the requirements for the ADC 21.

As described for the second embodiment, normalization is applied. The band pass filter output is connected to a two-way switch 22. Furthermore, the output from the second output port D2b is led past the band pass filter 19 and the amplifier 20 in a second branch B2', and connected directly to the switch 22. The switch 22 is connected to the ADC 21. The ADC is in turn connected to a digital signal processing (DSP) device 23 for further signal processing.

The measurement arrangement may be used for providing a feed-back control signal to the VCOs 7, 8 for acquiring a desired phase noise in a similar way as for the second embodiment example. Here, however, amplitude determining and control circuitry may be digital, which simplifies these devices. The VCO control signal can be made digital, which makes it easier to achieve lower phase noise. The measurement arrangement according to the second embodiment may also be arranged to supply a digital VCO control signal, making it easier to achieve lower phase noise in that case as well.

Figure 6:
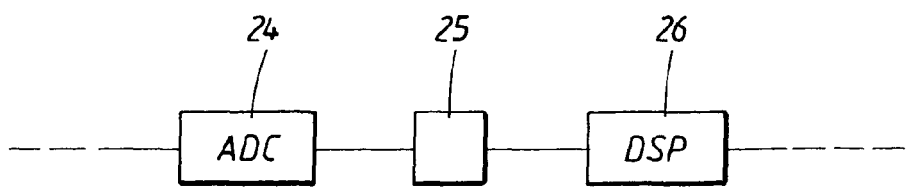
FIG. 6 shows a schematic for a fourth embodiment of the present invention.

In a fourth embodiment example, with reference to FIG. 6, the signal output from the LNA 3 is fed directly to an ADC 24 and then digitally filtered in a digital filter 25. The output from the digital filter is fed into a digital signal processing (DSP) device 26.

Furthermore, when regarding the output from the LNA 3 in FIG. 2, there are a number of different ways to determine phase noise:

The signal from the output of the LNA 3 can be connected to an analyzing device off the chip and analyzed. It is then possible to get the complete phase noise spectrum in absolute numbers. There are four different alternative examples described below.

1. The signal from the LNA 3 is first band pass filtered on the chip before being connected to an analyzing device off the chip. The output amplitude is then proportional to the phase noise power in the offset frequency interval given by the band pass characteristics.
2. The amplitude of the signal from the band pass filter is determined in an amplitude detecting circuit on the chip and then connected to an analyzing device off the chip. This signal is proportional to the phase noise at the offset given by the band pass filter. This is thus essentially a DC signal which is easy to measure also in production. It can be calibrated to give absolute phase noise.
3. The output of the LNA 3 is digitized by means of an ADC, either after band pass filtering, or without band pass filtering. This signal is then connected to an analyzing device off the chip for FFT or some other signal processing in order to determine phase noise.
4. The FFT is integrated on the chip, supplying a complete phase noise spectrum that can be connected to an analyzing device off the chip. This is normally not necessary for running production testing, but enables a deeper analysis if desired.

The absolute phase noise can be determined from formulas disclosed in the previously mentioned paper "Phase-Noise Measurement Using Two Inter-Injection-Locked Microwave Oscillators", M. Nick, A. Banai, and F. Farzaneh, IEEE Trans. Microw. Theory Tech., Vol. 54, No. 7, pp. 2993-3000, July 2006, or by a calibration procedure. Such a calibration procedure could be performed by applying a modulation signal of known amplitude to varactors in the VCOs. The resulting modulation side-band signal in the output spectrum from the LNA 3 should then have a known amplitude. By measuring this signal, the calibration constant can be determined. The calibration is for example used for taking LNA gain and mixer gain into account.

The present invention is not limited to the embodiment examples described above, but may vary freely within the scope of the appended claims.

The formulas and calibration procedure mentioned above may be used for feed-back control of the phase noise as well. Generally, there are four alternatives:
1. The detected noise is calibrated and normalized, thus constituting a relative phase noise level that is the most usual form of phase noise measure. This phase noise measure may be compared against a threshold value for maintaining a desired phase noise value which may be a trade-off against power consumption, i.e. not necessarily the lowest phase noise value possible.
2. The detected noise is normalized, constituting an uncalibrated phase noise that may be used in a relative way e.g. to minimize the phase noise in a feedback loop.
3. The detected noise is calibrated, thus constituting an absolute measure of the output noise power. This alternative is rarely used.
4. The detected noise is used directly in a feed-back loop for minimizing the phase noise value.

If the VCOs are used in a PLL (Phase-Locked Loop) coupling, the present invention enables control of PLL-parameters in a so-called ΣΔ-loop in such a way that spurious signals may be minimized.

The differential oscillators may comprise other circuit elements than those described in the examples. The VCO current and voltage supplies and their associated circuitry may for example be of any suitable nature. The drive part and resonator part of the resonators may also have any suitable form that is apparent to the skilled person.

The feedback line 11, 12 for controlling the VCOs dependent on the detected phase noise shown in FIG. 2 may of course be used for all embodiments shown if desired.

Which devices that are external and which are placed on the chip may vary, for example the external device 6 according to the first embodiment may be placed on the chip as well. On the other hand, both the FFT device 5 and the external device 6 may be external.

In the embodiment examples, differential VCOs are used as oscillators. Generally, the oscillators need not be differential and do not have to have a controllable frequency. For the present invention, it is sufficient if the oscillators are inter-injection locked to each other by means of at least one coupling element in such a way that a quadrature output is provided automatically, without any special tuning. The coupling element may be as simple as a direct electrical coupling without any further components, or may comprise a component as shown with the reference letter Q in FIG. 2. Such a component may for example be the described capacitor. Using such a component makes it possible to control the degree of coupling.

The second and third embodiments may be used to provide VCO feed-back control without normalization. In which cases normalization is preferred has been described previously.

The digital signal processors (DSPs) mentioned may be any kind of suitable computer devices.

The Fourier transform may be calculated in many known ways, the fast Fourier transform is only one example.

The invention claimed is:

1. An oscillator arrangement arranged for providing an oscillator output and phase noise detection and/or control of said oscillator output, the oscillator arrangement comprising:
   a mixer;
   a low-pass filter connected to the mixer;
   a first oscillator;
   a second oscillator; and
   a phase noise measurement arrangement coupled to the low-pass filter and configured to produce a signal based on the output of the low-pass filter for use in producing a feedback signal for controlling the first and second oscillators, wherein
   the first and second oscillators are inter-injection locked to each other by at least one coupling element in such a way that the oscillator output is acquired in quadrature automatically, and
   the mixer, low-pass filter, oscillators, coupling element, and phase noise measurement arrangement are realized on a single chip.

2. The oscillator arrangement according to claim 1, wherein the first oscillator and the second oscillator are differential oscillators.

3. The oscillator arrangement according to claim 2, wherein each differential oscillator is voltage-controlled and comprises a first drive transistor and a second drive transistor, the emitters of the first drive transistor and the second drive transistor of the first oscillator being connected to each other, and the emitters of the first drive transistor and the second drive transistor of the second oscillator being connected to each other, and where said at least one coupling element is connected between, on one hand, the emitters of the drive transistors of the first oscillator and, on the other hand, the emitters of the drive transistors of the second oscillator.

4. The oscillator arrangement according to claim 1, wherein the low-pass filter is followed by a low noise amplifier, an analog to digital converter and a computer device.

5. The oscillator arrangement according to claim 4, wherein a power splitter, having a first branch and a second branch, is placed between the low-noise amplifier and the analog to digital converter, the first branch comprising a band-pass filter, the branches further being connected to the analog to digital converter via a switch.

6. The oscillator arrangement according to claim 4, wherein the computer device is arranged for performing a Fourier transform.

7. The oscillator arrangement according to claim 6, wherein the Fourier transform is output to a device which calculates the phase noise.

8. The oscillator arrangement according to claim 6, wherein the Fourier transform is a fast Fourier transform, FFT.

9. The oscillator arrangement according to claim 1, wherein the coupling element is a capacitor.

10. The oscillator arrangement according to claim 1, wherein the low-pass filter is followed by a low noise amplifier and a power splitter having a first branch and a second branch, where the branches are connected to a corresponding first amplitude detecting device and second amplitude detecting device, the first branch being connected to the first amplitude detecting device via a band-pass filter, the outputs of the amplitude detecting devices further being connected to a ratio detecting device.

11. The oscillator arrangement according to claim 1, wherein the phase noise measurement arrangement comprises:
    a low noise amplifier (LNA) having an input port coupled an output port of the low-pass filter; and
    a power splitter having an input coupled to an output port of the LNA, the power splitter having a first output port and a second output port.

12. The oscillator arrangement according to claim 1, wherein the phase noise measurement arrangement comprises:
    a low noise amplifier (LNA) having an input port coupled an output port of the low-pass filter;
    an analog to digital converter (ADC) having an input port coupled to an output port of the LNA such that a signal output from the LNA is fed directly to the ADC;
    a digital filter for filtering the output of the ADC; and
    a digital signal processing (DSP) device for receiving and processing an output from the digital filter.

13. The oscillator arrangement according to claim 1, wherein the phase noise measurement arrangement comprises:
    a low noise amplifier (LNA) having an input port coupled an output port of the low-pass filter;
    an analog to digital converter (ADC) having an input port coupled to an output port of the LNA such that a signal output from the LNA is fed directly to the ADC; and
    a digital signal processing (DSP) device for receiving and processing an output from the ADC.

14. A method for detecting and/or controlling phase noise from an oscillator arrangement comprising a first oscillator and a second oscillator, wherein the oscillators are inter-injection locked to each other by at least one coupling element in such a way that an output in quadrature is acquired automatically, wherein said output in quadrature is connected to a mixer connected to a low-pass filter, comprising:
    using a phase noise measurement arrangement connected to the low-pass filter to produce a feedback signal;
    using the feedback signal to control the oscillators, wherein the first oscillator, the second oscillator, the coupling element, the mixer, the low pass filter, and the phase noise measurement arrangement are realized on a single chip.

15. The method according to claim 14, wherein at least a part of the detected phase noise is used for controlling the first oscillator and the second oscillator in such a way that a desired phase noise level is acquired.

16. The method according to claim 15, wherein the detected phase noise is calibrated and/or normalized.

17. The method according to claim 14, wherein the detected phase noise is Fourier transformed.

18. The method according to claim 14, wherein voltage-controlled oscillators are used as oscillators.

19. The oscillator arrangement according to claim 11, wherein the phase noise measurement arrangement further comprises:
    a bandpass filter having an input coupled to the first output port so that the filter can receive the signal output via the first output port; and
    an amplifier having an input coupled to the an output of the bandpass filter so that the amplifier can receive and amplify the signal output by the bandpass filter.

20. The oscillator arrangement according to claim 19, wherein the phase noise measurement arrangement further comprises:
    a first amplitude detecting circuit having an input coupled to the an output of the amplifier so that the first amplitude detecting circuit can receive the signal output by the amplifier;
    a second amplitude detecting circuit having an input coupled to the second output port of the power splitter so that the second amplitude detecting circuit can receive the signal output via the second output port; and
    a divider having a first input coupled to an output of the first amplitude detecting circuit and a second input coupled to an output of the second amplitude detecting circuit.

21. The oscillator arrangement according to claim 19, wherein the phase noise measurement arrangement further comprises:
    a switch comprising a first terminal, a second terminal, and a third terminal, wherein the switch has a first mode of operation in which the first terminal, but not the second terminal is connected to the third terminal and a second mode of operation in which the second terminal, but not the first terminal is connected to the third terminal, wherein
    the first terminal of the switch is coupled to an output of the amplifier, and
    the second terminal of the switch is coupled to the second output port.

22. The oscillator arrangement according to claim 21, wherein the phase noise measurement arrangement further comprises:
    an analog to digital converter (ADC) having an input port coupled to the third terminal of the switch.

23. The oscillator arrangement according to claim 22, wherein the phase noise measurement arrangement further comprises a digital signal processor having an input port coupled to an output port of the ADC.

* * * * *